United States Patent [19]

Matsubara

[11] Patent Number: 5,990,759

[45] Date of Patent: Nov. 23, 1999

[54] DIRECTIONAL COUPLER ROTATABLE AROUND A FULCRUM

[75] Inventor: Hiroshi Matsubara, Nisshin, Japan

[73] Assignee: Maspro Denkoh, Co., Ltd., Aichi, Japan

[21] Appl. No.: 09/011,861

[22] PCT Filed: Jun. 18, 1996

[86] PCT No.: PCT/JP96/01665

§ 371 Date: Aug. 10, 1998

§ 102(e) Date: Aug. 10, 1998

[87] PCT Pub. No.: WO97/49180

PCT Pub. Date: Dec. 24, 1997

[51] Int. Cl.[6] .................................................. H01D 5/18
[52] U.S. Cl. ................................. 333/109; 333/112
[58] Field of Search .............................. 333/100, 109, 333/111, 112, 115, 116, 136

[56] References Cited

U.S. PATENT DOCUMENTS

| | | | |
|---|---|---|---|
| 3,641,464 | 2/1972 | Crowhurst et al. | 333/112 |
| 4,476,447 | 10/1984 | Lauchner | 333/111 |
| 5,058,198 | 10/1991 | Rocci et al. | 333/109 X |
| 5,638,035 | 6/1997 | Romerein et al. | 333/101 |

FOREIGN PATENT DOCUMENTS

| | | |
|---|---|---|
| 58-44612 | 10/1983 | Japan . |
| 62-44618 | 11/1987 | Japan . |

*Primary Examiner*—Robert Pascal
*Assistant Examiner*—Justin P. Bettendorf
*Attorney, Agent, or Firm*—Pearson & Pearson

[57] ABSTRACT

A directional coupler makes it possible to switch the input terminal and the output terminal thereof in position. A branch unit (5) containing a branching circuit (5a) is mounted so that the branch unit (5) can be rotated relative to a mother board (4), with a central portion of the branch unit (5) being a fulcrum. An input terminal (12) and an output terminal (13) are provided at positions corresponding to relay terminals (10, 11) of the mother board 4.

3 Claims, 4 Drawing Sheets

DIRECTIONAL COUPLER ROTATABLE AROUND A FULCRUM

TECHNICAL FIELD

The present invention relates to direction couplers and, more particularly, to a direction coupler suitable for CATV.

BACKGROUND ART

In CATV networks, there are cases wherein a transmission route needs to be modified due to an increase in the number of subscribers or relocation of a relay station or the like.

If the number of subscribers increases, the number of branches (distributions) must be increased. If a relay station or the like is relocated, there may be cases wherein the direction of transmission becomes opposite.

With conventional directional couplers, such cases must be coped with by replacing a tap plate with one for an increased number of branches. To reverse the direction of transmission, the cable connections are reversed, or the direction coupler itself is remounted in a reversed right-left position.

However, the reversing of cable connection may not be easy. If an existing cable may be disconnected, the cable may well be too short to connect to the opposite terminal. Since an extension cable cannot be used for the reconnection, it becomes necessary to replace all the cables along the route to be modified. The costs required therefor is unignorable.

The remounting of a direction coupler into a reversed right-left position is not easy, either. Since cables used for CATV are thick and difficult to handle, it is not easy to disconnect cables from and reconnect the cables to a direction coupler.

In works for reversing the direction of transmission, increases in the number of branches are often required as well.

DISCLOSURE OF THE INVENTION

Therefore, according to the invention, there is provided a directional coupler that makes it possible to reverse the direction of transmission without disconnecting it from the cables and, further, makes it easy to change the number of branches. The directional coupler has a construction wherein a mother board having a current passing circuit and a branch unit having a branching circuit are arranged in parallel between first and second terminals, and the mother board is connected to said first and second terminals so that current can pass through each terminal, and the branch unit is mounted, relative to the mother board, so that an input terminal of the branch unit is connected to one terminal selected from said first and second terminals so as to allow transmission of a high frequency signal, and so that an output terminal of said branch unit is connected to the other one of the terminals so as to allow transmission of a high frequency signal, and wherein a tap plate having a distributing circuit is connected to a branch terminal of said branch unit so as to allow transmission of a high frequency signal.

The high frequency signal herein includes a television signal, a control signal, and a communication transmission signal as in telephone.

The directional coupler may further have a construction wherein the branch unit is supported to the mother board so that the branch unit can be rotated along a surface of the mother board, with a central portion of the branch unit being a fulcrum, and the branch unit has terminals for input and for output which are provided at positions symmetrical about said fulcrum, and wherein corresponding to the input terminal and the output terminal of the branch unit, the mother board has relay terminals that are respectively connected to the first and second terminals so that a high frequency signal can be transmitted.

Furthermore, the branch terminal of the branch unit may be provided at a position of a center of rotation.

The input side and the output side of the branch unit can be reversed merely by replacing the connections to the first and second terminals where a high frequency signal can be transmitted, with each other.

The number of branch terminals or the amount of branching can be changed simply by replacing the entire unit. If the branch unit is rotatably supported, the connections can be easily changed.

BEST MODE FOR CARRYING OUT THE INVENTION

Figure 1:
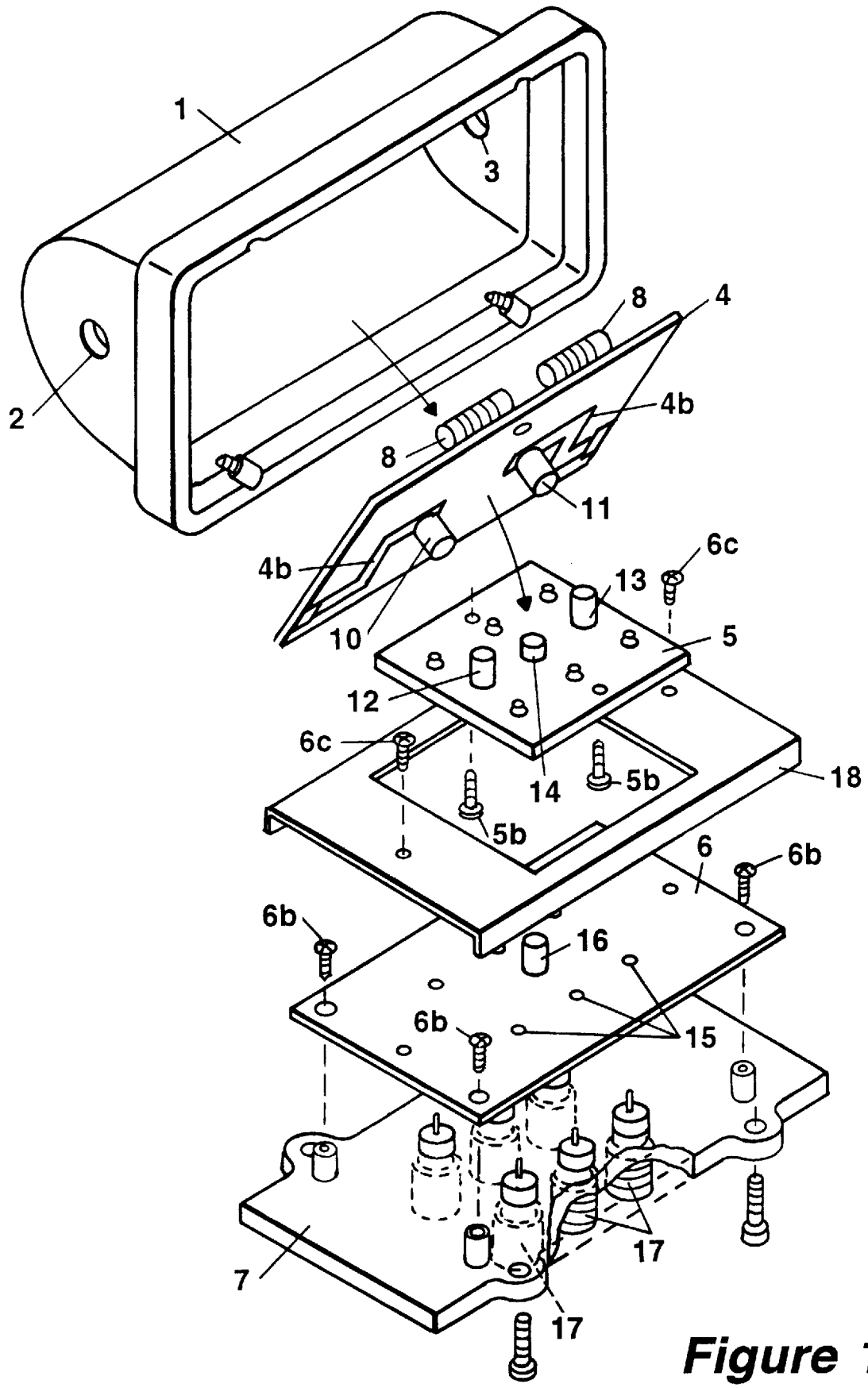
FIG. 1 is an exploded view illustrating an embodiment of the directional coupler of the present invention.

A directional coupler according to the present invention will be described with reference to the drawings.

Reference numeral 1 represents a cover body having an opening at one side. The cover body 1 has a cable insert hole 2 that is formed as a connecting portion for a first terminal A in a side of the cover body 1, and a cable insert hole 3 that is formed as a connecting portion for a second terminal B in another side of the cover body 1. A mother board 4 and a branch unit 5 are housed inside the cover body 1. The opening side of the cover body 1 is closed by a lid body 7 to which a tap plate 6 is integrally attached.

Figure 2:
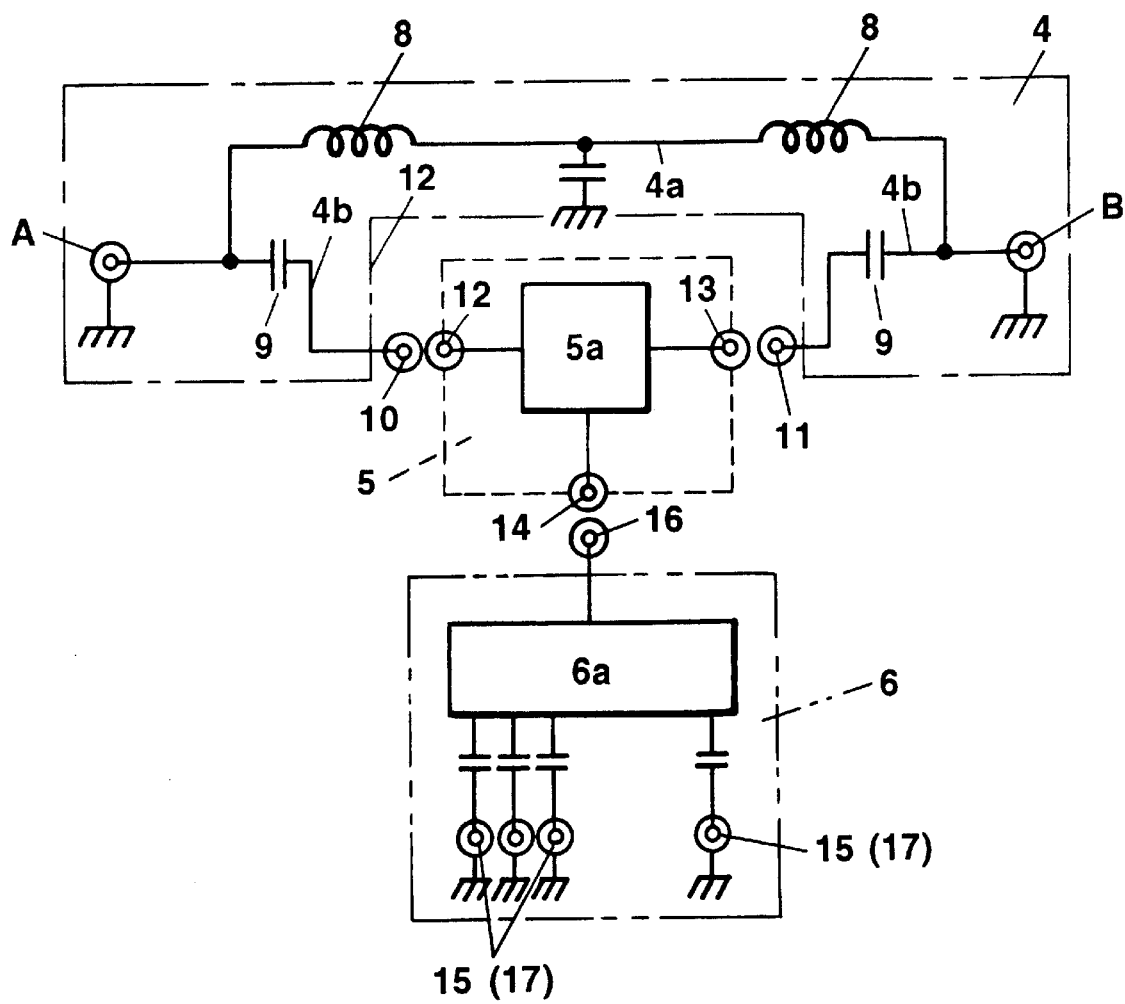
FIG. 2 is an illustrated diagram of a circuit of the directional coupler.

The mother board 4 is fixed to the cover body 1. The mother board 4 has a current passing circuit 4a that is provided with coils 8, 8 as shown in FIG. 2, thereby allowing passage of current between the terminal A and the terminal B. Relay circuits 4b, 4b having capacitors 9, 9 provide relay terminals 10, 11 that are connected to the terminals A, B so that a high frequency signal can be transmitted.

The first and second terminals A and B are designed so that the cores of coaxial cables can be screwed thereto when the cables are inserted through the cable insert holes.

The branch unit 5 contains a branching circuit 5a, and is mounted so that the branch unit 5 can be rotated relative to the mother board 4, with a central portion of the branch unit 5 being a fulcrum. The branch unit 5 has an input terminal 12 and an output terminal 13. The relay terminals 10, 11 of the mother board 4 are provided at positions corresponding to the input terminal 12 and the output terminal 13 of the branch unit 5.

A branch terminal 14 is provided at the rotation fulcrum. Fixation to the mother board 4 is made by screws 5b, 5b.

That tap plate 6 is fixed to the lid body 7 by screws 6b, 6b . . . . The tap plate 6 has a distributing circuit 6a and a plurality of distributing terminals 15, 15 . . . . The tap plate 6 has a connecting terminal 16 corresponding to the branch terminal 14.

The lid body 7 has connector seats 17, 17 . . . corresponding in number to the distributing terminals 15, 15 . . .

A side of the tap plate 6 facing the branch unit is covered with a cover 18 fixed by screws 6c, 6c. The distributing terminals 15, 15 . . . are connected to the connectors seats 17, 17 . . .

Figure 3:
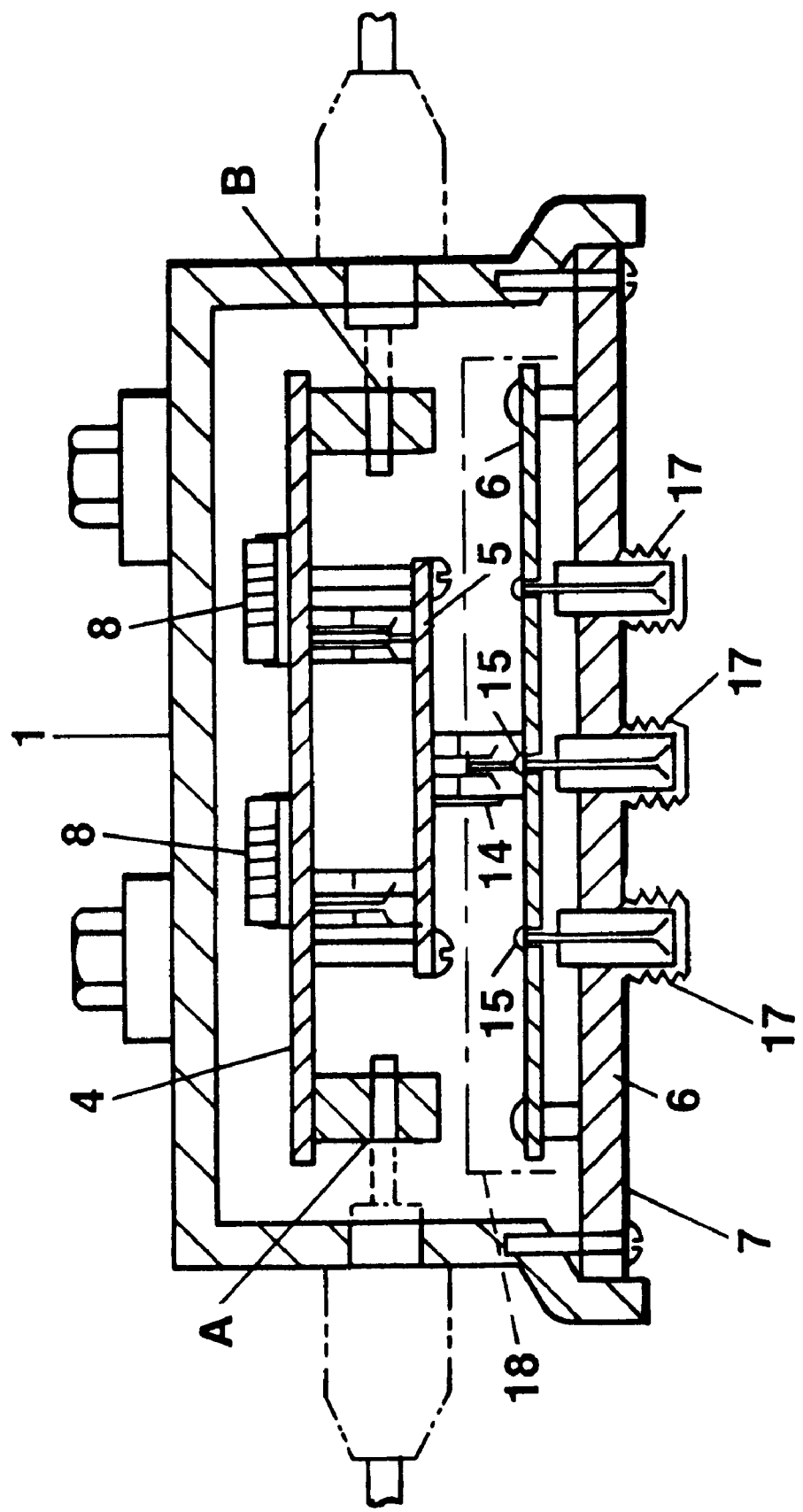
FIG. 3 is an illustrative diagram of an internal construction of the directional coupler.

FIG. 3 shows the internal construction of the direction coupler. The lid body 7 closes off the open side of the cover body 1. The tap plate 6 attaches by screws 6b to the lid body 7, and as described hereinbefore the distributing terminals 15, 15 . . . are connected to the connector seats 17,17 . . . . The side of the tap plate 6 having the branch unit 5 is covered with a cover 18. The branch unit 5 has a branch terminal 14 that connects to terminal 16 of the tap plate 6, and branch terminal 14 acts as the rotation fulcrum when rotating the branch unit 5. The branch unit 5 is fixed to the mother board 4 by screws 5b. Coils 8 sit on top of the mother board 4. First terminal A and second terminal B provide for connection to the cores of the coaxial cables.

In the thus-formed directional coupler, one of the terminals A and B that is connected to the input-side terminal 12 of the branch unit 5 so as to allow transmission of a high frequency signal operates as a terminal-connecting portion for input, so that transmission signals are sent out to the connector seats 17, 17 . . . of the lid body 7.

To increase the number of branches and change the amount of branching, the lid body 7 is removed, and the tap plate 6 and the branch unit 5 are taken out. In place of them, a lid body and a tap plate that match the desired number of branches, and a branch unit adapted to the desired amount of branching, are set in.

Figure 4A:
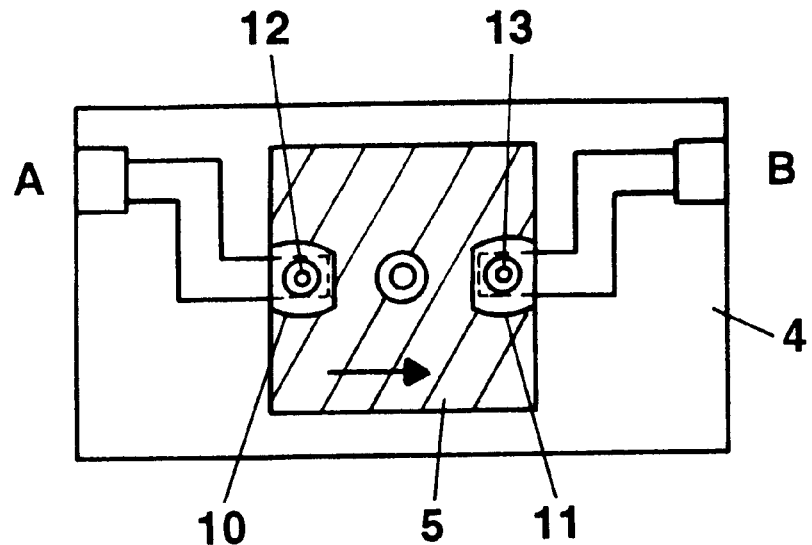
FIGS. 4(a) & 4(b) are diagrams illustrating an operation of changing the direction of electricity transmission.
Figure 4B:
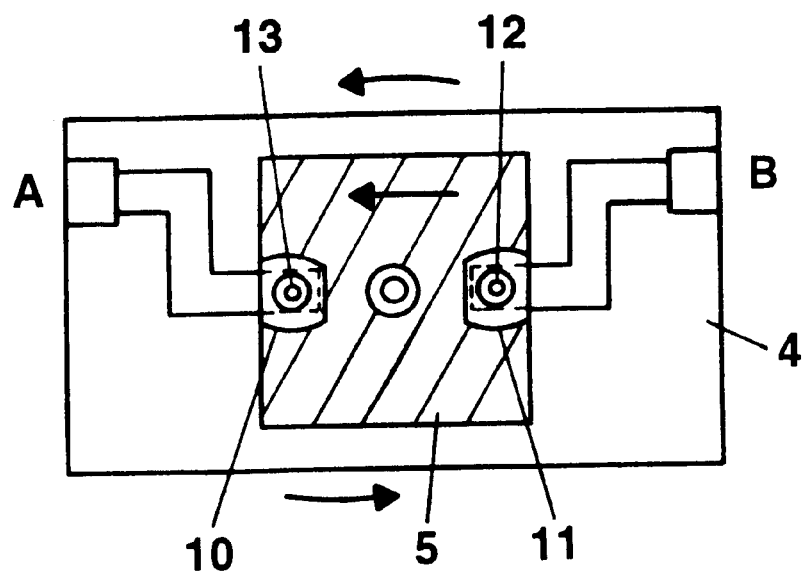

To reverse the direction of transmission, the branch unit 5 is reconnected in a reversed right-left position so that the input terminal 12 and the output terminal 13 of the branch unit 5 are switched in position relative to the relay terminals 10, 11 of the mother board 4, that is, from the position in FIG. 4a to the position in FIG. 4b. Thus, the input side and the output side can easily be switched.

As described above, the current passing circuit 4a, the branching circuit 5a and the distributing circuit 6a are formed in separate units, that is, the mother board 4, the branch unit 5 and the tap plate 6, respectively. Further, the mother board 4 is fixed to the cover body 1 so that current passage between the terminals A and B is allowed. Therefore, during a replacement operation, current passage is not interrupted, and the checking function is maintained. To change the number of branches, the branch unit 5 is replaced with a unit that matches the desired amount of branching, and the tap plate 6 and the lid body 7 are replaced as well. This easy operation can be performed simultaneously with an operation of changing the direction of transmission.

The connecting portions for the first and second terminals A, B are not limited to a construction as in the embodiment wherein the cores of coaxial cables inserted through the cable insert holes are screwed to the mother board. The connections may also be established using connectors.

The number of branches is not always increased but, in some cases, it is decreased. The number of branches in a tap plate may be any number. Current passing-type distributing terminals may also be employed Thus, various modifications are possible.

In the embodiment, the branch unit 5 is rotatable to switch the terminals 12, 13 in position and the branch terminal 14 is provided and functions as the rotation fulcrum, so that the switching operation can easily be performed. However, it is also possible to switch the terminal connections 12, 13 by sliding or moving a branch unit 5.

Furthermore, it is also possible to employ current passing-type distributing terminals.

According to the present invention, it becomes possible to accomplish an increase in the number of branch terminals and a change in the direction of transmission separately or simultaneously without discontinuing current passage.

I claim:

1. A direction coupler wherein a mother board having a current passing circuit and a branch unit having a branching circuit are arranged in parallel between first and second terminals, and the mother board is connected to said first and second terminals so that current can pass through each terminal, and the branch unit is supported, relative to the mother board, so that the branch unit can be rotated along a surface of the mother board, with a central portion of the branch unit being a fulcrum, and so that an input terminal of the branch unit is connected to one terminal selected from said first and second terminals so as to allow transmission of a high frequency signal, and so that an output terminal of said branch unit is connected to the other one of the terminals so as to allow transmission of a high frequency signal, and wherein a tap plate having a distributing circuit is connected to a branch terminal of said branch unit so as to allow transmission of a high frequency signal.

2. A direction coupler according to claim 1, wherein the branch unit has terminals for input and for output which are provided at positions symmetrical about said fulcrum, and wherein corresponding to the input terminal and the output terminal of the branch unit, the mother board has relay terminals that are respectively connected to the first and second terminals so that a high frequency signal can be transmitted.

3. A direction coupler according to claim 2, wherein the branch terminal of the branch unit is provided at a position of a center of rotation.

* * * * *